(12) United States Patent
Francis et al.

(10) Patent No.: US 9,374,904 B2
(45) Date of Patent: Jun. 21, 2016

(54) THERMAL GROUND PLANES AND LIGHT-EMITTING DIODES

(71) Applicant: i2C Solutions, LLC, Louisville, CO (US)

(72) Inventors: William Francis, Louisville, CO (US); Michael Hulse, Louisville, CO (US)

(73) Assignee: i2C Solutions, LLC, Louisville, CO (US)

( * ) Notice: Subject to any disclaimer, the term of this patent is extended or adjusted under 35 U.S.C. 154(b) by 0 days.

(21) Appl. No.: 14/185,669

(22) Filed: Feb. 20, 2014

(65) Prior Publication Data

US 2015/0200344 A1 Jul. 16, 2015

Related U.S. Application Data

(60) Provisional application No. 61/926,057, filed on Jan. 10, 2014.

(51) Int. Cl.
*H01L 31/02* (2006.01)
*H05K 1/00* (2006.01)
*H05K 3/00* (2006.01)
*F21V 29/00* (2015.01)

(52) U.S. Cl.
CPC .............. *H05K 3/0058* (2013.01); *F21V 29/00* (2013.01); *H01L 2224/48091* (2013.01); *H01L 2224/48247* (2013.01); *H05K 3/0061* (2013.01); *H05K 2201/10106* (2013.01)

(58) Field of Classification Search
CPC .................................. H01L 31/02; H05K 1/00
USPC ............................................................. 257/99
See application file for complete search history.

(56) References Cited

U.S. PATENT DOCUMENTS

| 6,446,706 | B1 | 9/2002 | Rosenfeld |
| 8,069,907 | B2 | 12/2011 | Bryant |
| 2008/0087456 | A1* | 4/2008 | Schuette ........................ 174/252 |
| 2011/0017431 | A1 | 1/2011 | Yang |
| 2015/0167951 | A1* | 6/2015 | Garelli et al. .................... 257/99 |

* cited by examiner

*Primary Examiner* — Marc Armand
(74) *Attorney, Agent, or Firm* — Wilson Patent Law, LLC

(57) ABSTRACT

Methods and systems for thermal management of one or more LEDs are disclosed. One or more LEDs may be coupled with an external layer of a thermal ground plane according to some embodiments described herein. For example, the one or more LEDs may be electrically coupled with a circuit carrier with one or more electrically conductive traces etched therein prior to coupling with the thermal ground plane. The thermal ground plane may be charged with a working fluid and/or hermetically sealed after being coupled with the LED.

24 Claims, 10 Drawing Sheets

US 9,374,904 B2

THERMAL GROUND PLANES AND LIGHT-EMITTING DIODES

CROSS-REFERENCE TO RELATED APPLICATIONS

This application claims priority to U.S. Provisional Application No. 61/926,057, filed Jan. 10, 2014, titled "THERMAL GROUND PLANES AND LIGHT EMITTING DIODES", which is incorporated herein by reference in its entirety.

BACKGROUND

It is well known that light-emitting diodes (LEDs) generate a lot of heat that may adversely affect the performance and/or the reliability. Indeed, elevated junction temperatures have been shown to cause an LED to produce less light (lumen output) and less forward current (or less forward voltage). Over time, higher junction temperatures may also significantly accelerate chip degeneration. Furthermore, high power LEDs can use significantly more power than a typical LED. Most of this additional power is converted to heat rather than light (about 70% heat and 30% light).

SUMMARY

Methods and systems for thermal management of one or more LEDs are disclosed. One or more LEDs may be coupled with an external layer of a thermal ground plane according to some embodiments described herein. For example, the one or more LEDs may be electrically coupled with a circuit carrier with one or more electrically conductive traces etched therein prior to coupling with the thermal ground plane. The thermal ground plane may be charged with a working fluid and/or hermetically sealed after being coupled with the LED.

BRIEF DESCRIPTION OF THE FIGURES

These and other features, aspects, and advantages of the present disclosure are better understood when the following Detailed Description is read with reference to the accompanying drawings.

DETAILED DESCRIPTION

Embodiments described herein include one or more light-emitting diodes (LEDs) coupled with a thermal ground plane. Thermal ground planes work much like heat pipes in that they utilize phase transformation of an internal working fluid to enable higher effective thermal conductivity than is possible with a single material. In some cases, thermal ground planes can increase thermal conductivity by an order of magnitude over conventional techniques. Thermal ground planes may include a thin, planar form allowing LEDs to be thermally bonded to an external surface rather than on a standard LED substrate such as fiberglass-reinforced polymer or aluminum boards. The high thermal conductivity of a thermal ground plane may allow LEDs to operate at higher power and/or greater efficiency. In some embodiments, this may result in LED lighting devices utilizing fewer LEDs to produce the desired lumen output. Better thermal conductivity may, among other things, improve an LED's life span and/or result in a more consistent color output of an LED.

Figure 1A:
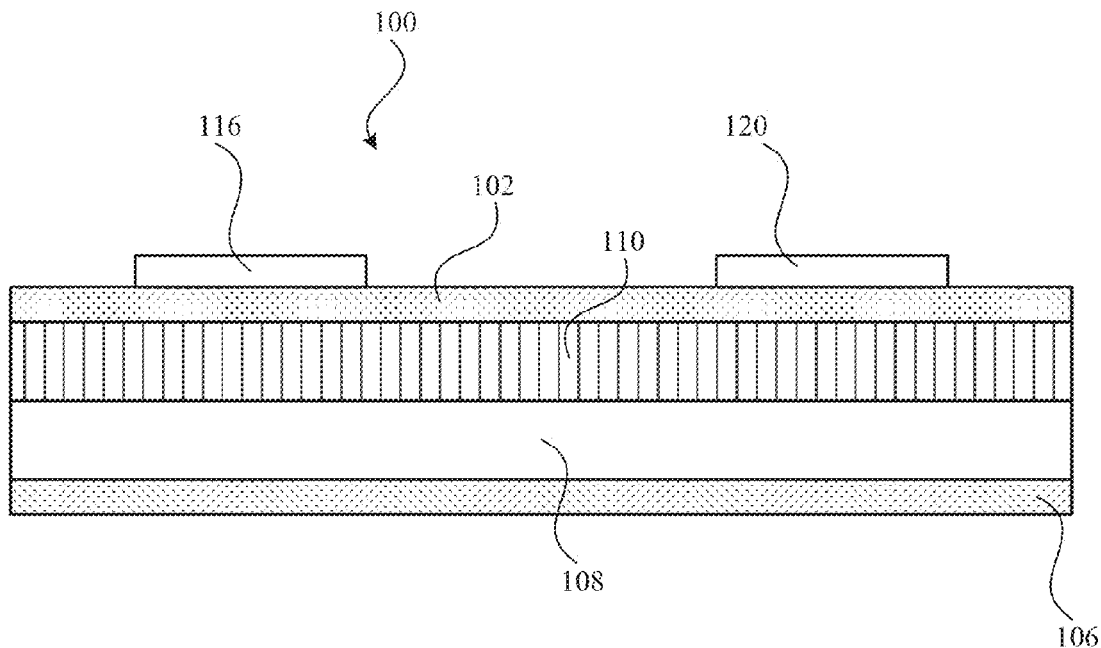
FIG. 1A illustrates a block diagram of a thermal ground plane according to some embodiments described herein.

FIG. 1A illustrates a block diagram of a thermal ground plane 100 according to some embodiments described herein. The thermal ground plane 100 may have a thickness less than about 5, 2.5, 1.0, 0.75, or 0.5 mm. The thermal ground plane 100 may include a containment layer 102 and a containment layer 106. The containment layer 102 and the containment layer 106 may enclose a liquid cavity 110 and a vapor cavity 108. The containment layer 102 and/or the containment layer 106 may include copper clad Kapton®, titanium, aluminum, copper, metal, composite material, polymer film, kapton, Pyralux®, polyimide film, alumina, polyethylene terephthalate (PET), a combination of the above, or any other material. The containment layer 102 and/or the containment layer 106, for example, may have a thickness of about 25-500 um.

The vapor cavity 108 may include a porous structure (e.g., a three-dimensional porous structure) that resists external pressure while allowing internal vapor transport such that the vapor can easily move away from the heat source and condense at the heat sink. The vapor cavity 108 may include a woven mesh (e.g., a plain woven mesh) with opening sizes, for example, on the order of 0.5 mm and/or a thickness less than 0.5 mm. As another example, the vapor cavity 108 may include a polyether ether ketone (PEEK) polymer material. As yet another example, the vapor cavity 108 may include mesh, foam, fabric or other porous material made of ceramic, polymer, or metal.

In some embodiments, the liquid cavity 110 may include one or more wicking layers that may wick the condensed working fluid back to the heat source. In some embodiments, the wicking layers may utilize hydrophilic coatings for maximal passive fluid pumping performance. The liquid cavity 110 may include, for example, a mesh or a woven mesh. Moreover, the liquid cavity 110 may also include micro channels etched into the containment layer 102 and/or the containment layer 106. Micro channels, for example, may be about 100 microns deep and 100 microns wide. The liquid cavity 110 may also include a micro porous foam, sintered metal, etc.

In some embodiments, the liquid cavity 110 may include a plurality of pillars (or micro channels) that form a wicking structure on the inner surface of the containment layer 102. The pillars may be made from titanium, copper, aluminum, gold, composite material, nano-structured titania, titanium oxide, titanium, a composite of titanium with other metals such as gold or copper, or other materials either alone or as a composite The pillars may have, for example, a height of about 5-200 microns, and a diameter of about 5-500 microns. The spacing between the pillars (i.e., the gap) can be about 1-500 microns. These dimensions of the pillars, e.g., height, diameter, and spacing (or gap), are controlled and optionally varied within the plurality of pillars within the thermal ground plane in order to maximize thermal ground plane performance. For instance, the dimensions can be designed such that viscous losses are minimized and capillary forces are maximized in order to improve thermal ground plane performance. Although the dimensions, or characteristics, of the pillars can vary throughout the thermal ground plane, the characteristics can vary locally within the thermal ground plane or can vary from one pillar to another pillar, as desired for a given application or use of the thermal ground plane. The pillars may form all or part of the vapor cavity 108 and/or the liquid cavity 110.

A heat source 116 may be coupled with the containment layer 102. The heat source, for example, may include a light-emitting diode. In some embodiments, the heat source 116 may be manufactured on the containment layer 102. As heat is generated by the heat source 116, the containment layer 102 and wicking structure transfer the heat to a working fluid disposed within the liquid cavity 110. The working fluid may be any fluid that has a latent heat of vaporization. The working fluid may include water, mercury, sodium, indium, ammonium, acetone, ammonia, alcohol, and/or ethanol. The heat from the heat source 116 is transferred to the fluid, which isothermally transforms the fluid from a liquid phase into a vapor phase absorbing the latent heat of evaporation. The evaporation of fluid from the wicking structure creates a region void of liquid in the wicking structure. This void of liquid creates a capillary force through surface tension that draws liquid through the wicking structure, and allows vapor to be transported within the vapor cavity 108 as a result of a pressure gradient. The vapor condenses and returns to a liquid state, thereby releasing the latent heat of evaporation at the location of condensation near a heat sink 120. The liquid may be transported through the liquid cavity, which may include a wicking structure, from the cooler region near the heat sink 120 towards the hot region near the heat source 116, thereby completing the thermal transport cycle.

Furthermore, the thermal ground plane 100 can be designed to transfer heat out of the thermal ground plane 100, e.g., act as a cooling source at one area of the thermal ground plane 100. For example, the heat sink 120 can act as a removal area of heat for a device attached in that area, and the heat source 116 can remove the heat transferred through the vapor cavity 108. In essence, the structure can transport thermal energy in either direction, or act as a constant temperature source, for devices attached to the thermal ground plane 100.

The thickness of the containment layer 102 can be varied to be thinner at the location of the heat source 116 and thinner at the location of the heat sink 120, and thicker in other regions, which can be used for increased heat transfer, as a mounting location or indicia for the heat source 116, or other reasons, such as increasing structural integrity, as desired for the application of the structure. The varied thickness of the containment layer 102 can also facilitate thermal matching by reducing thermally-induced stresses imparted by the containment layer 102 to devices mounted to the thermal ground plane. This relatively small thickness of the containment layer 102 can be supported by thicker beams or pillars that extend from a first containment layer 102 to a second containment layer 106 through the vapor cavity 108, if such support is necessary for the given heat source 116. Further, a larger portion or the entirety of the containment layer 102 can be thinned to any desired thickness to increase thermal transfer, if desired or needed, for a given application of the structure.

In some embodiments, the vapor cavity 108 may span most of or a majority of the lateral dimension of the working portion of the thermal ground plane 100 and/or may take any form. In some embodiments, the vapor cavity 108 may have a depth of 10 microns to several millimeters, with a nominal thickness of 100 microns to 1 millimeter. In some embodiments, the design of the wicking structure may allow for high mass flow rates of the working fluid to be transported and thereby large amounts of heat to be transported. For example, large height and large spacing of the pillars will reduce viscous losses. In addition, smaller spacing of the pillars or smaller gaps in the mesh may increase capillary forces. Judicious choices of these parameters throughout the thermal ground plane 100 will provide optimum performance for a given application of the thermal ground plane 100.

In some embodiments, the pillars and/or mesh can be oxidized to form nano-structured titania, which can be used to increase wettability and thereby increase capillary forces, and enhance heat transfer, within the thermal ground plane 100.

In some embodiments, the heat source 116 and/or the heat sink 120 may be coupled with the same or opposite sides of the thermal ground plane 100. Moreover, the heat source 116 and/or the heat sink 120 may be coupled to the containment layer 102 using any type of coupling such as, for example, solder, thermal adhesive, thermal adhesive glue, thermal adhesive tape, conductive epoxy, thermal paste, etc.

In some embodiments, the thermal ground plane 100 may outperform heat pipes and/or vapor chambers. The thermal ground plane 100, for example, may have a thermal conductivity of greater than about 1,000 W/m-K, 1,250 W/m-K, 1,500 W/m-K, 1,750 W/m-K, or 2,000 W/m-K. It can be noted that the thermal conductivity of solid copper is about 400 W/m-K, and solid aluminum is about 200 W/m-K. In some embodiments, a polymer-based thermal ground plane according to embodiments described herein may have a heat flux of greater than 16, 18, 20, 22, 24, or 26 W/cm2, and a metal-based thermal ground plane according to embodiments described herein may have a heat flux of greater than 120 W/cm2, 140 W/cm2, 160 W/cm2, 180 W/cm2, etc.

In some embodiments, the thermal ground plane 100 may also include a containment layer surrounding the thermal ground plane 100 and hermetically sealing the internal volume at a partial vacuum pressure such that the boiling point of the working fluid occurs at the optimal operational temperature.

Figure 1B:
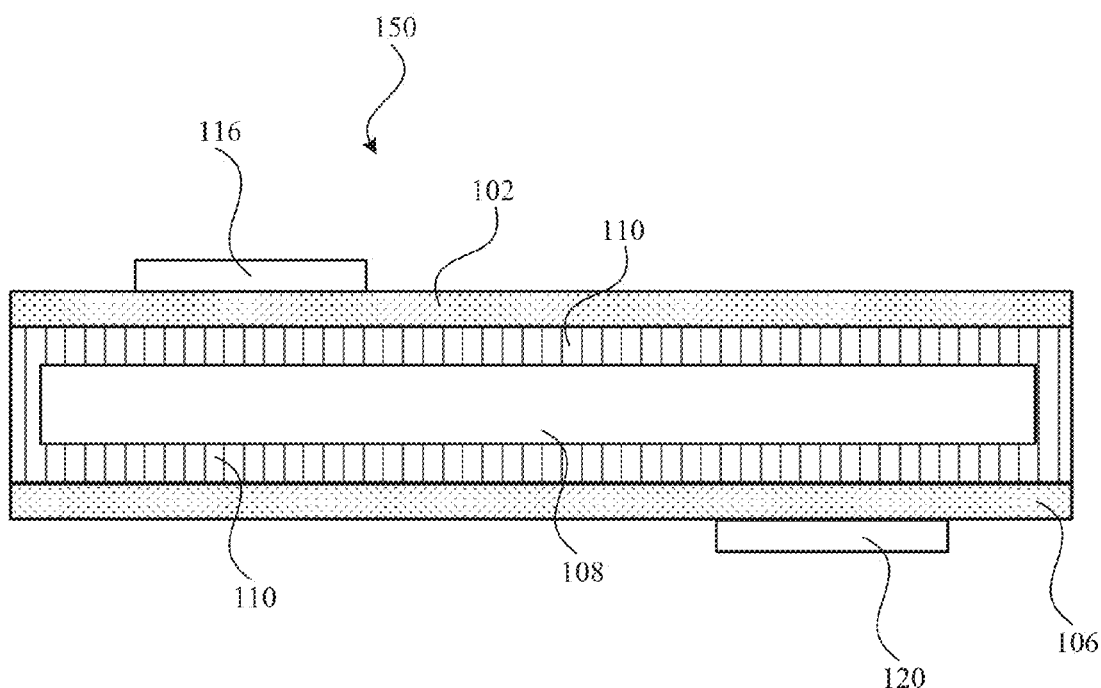
FIG. 1B illustrates a block diagram of another thermal ground plane according to some embodiments described herein.

FIG. 1B illustrates a block diagram of another thermal ground plane 150 according to some embodiments described herein. The thermal ground plane 100 may have a thickness less than about 5, 2.5, 1.0, 0.75, or 0.5 mm. Thermal ground plane 150 is similar to thermal ground plane 100 except the liquid cavity 110 is on both sides of the vapor cavity 108. The thermal ground plane 150 may also have a heat sink 120 on the containment layer 106 rather than containment layer 102. The liquid cavity 110 may conduct condensed liquid from heat sink 120 to the heat source 116.

Figure 2A:
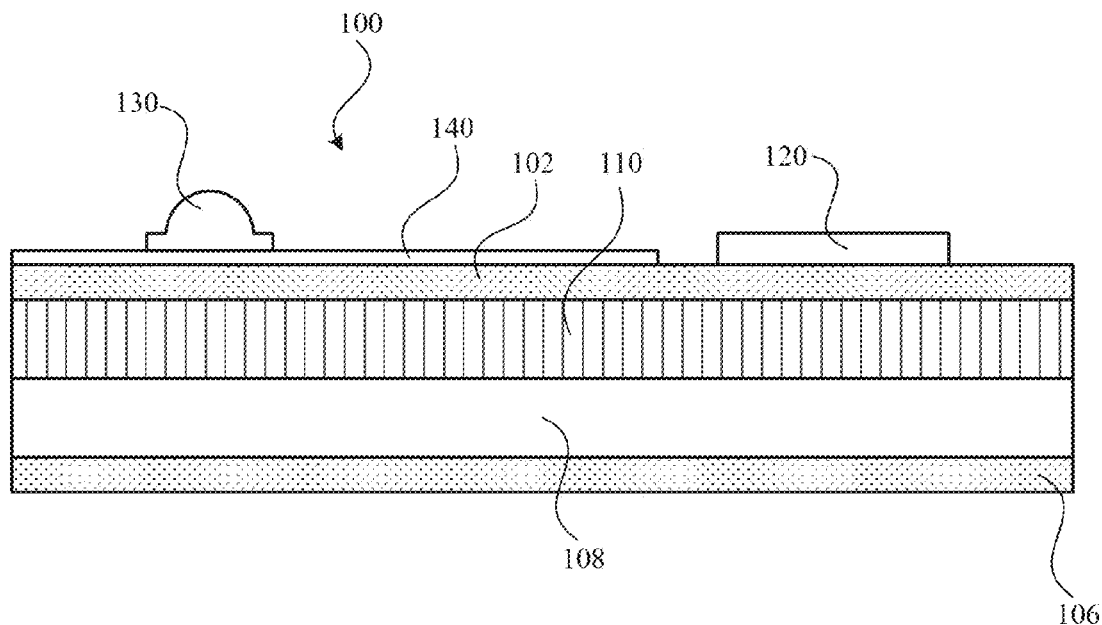
FIG. 2A illustrates a block diagram of a thermal ground plane according to some embodiments described herein.

FIG. 2A illustrates a block diagram of the thermal ground plane 100 with an LED 130 disposed on the containment layer 102 according to some embodiments described herein. In this embodiment, the thermal ground plane 100 is coupled with a circuit carrier 140 and one or more LEDs 130. The circuit carrier 140 may include any type of material upon which a circuit may be printed such as, for example, a copper layer on a kapton layer. The copper layer may be partially etched and/or may be a 1-oz copper layer. The kapton layer may have a thickness less than 500 μm, 400 μm, 300 μm, 200 μm, 100 μm, etc. The kapton layer may include a white or reflective coating.

The circuit carrier 140 may include various circuit elements such as paths, connections, traces, resistors, transistors, capacitors, inductors, diodes, integrated circuits, etc. Circuit elements may be soldered and/or etched on the circuit carrier 140. For example, traces may be etched in the copper layer and/or electrical devices, such as the LED 130, may be soldered (using any soldering process such a solder reflow process) to the circuit carrier 140. In some embodiments, the circuit carrier 140 may be bonded with the containment layer 102 using any type of bonding process such as thermal adhesive, thermal adhesive glue, thermal adhesive tape, etc.

In some embodiments, the LED 130 may be held at a specific operating temperature when coupled with the thermal ground plane 100. This operating temperature may be determined based on the selection of the working fluid and/or by setting internal thermal ground plane pressure. In some embodiments, the operating temperature may be below 100 C, 90 C, 80 C, 70 C, or 60 C. Reducing the operating temperature of the current state of the art from 120 C may increase the efficiency of LEDs by approximately 15%. In some embodiments, in use each individual LED used with a thermal ground plane may be operated at a higher current level, which may increase the luminous output of the LED and allow for a reduced number of LEDs to produce a given luminosity. In some embodiments, the increased efficiency and increased current load for each individual LED may enable use of approximately half the number of LEDs in a given solid state light engine. Furthermore, the cost of the light engine has a near one-to-one correlation with the number of LEDs used. The result may be a reduction in the solid state lightbulb manufacturing expense by 50%.

In some embodiments, the circuit carrier 140 may not be included. Instead, the LED 130 and/or other circuit elements such as a copper layer may be printed and/or soldered directly onto the containment layer 102 (or the containment layer 106) either before or after the other portions of the thermal ground plane are coupled together to form the thermal ground plane.

Figure 2B:
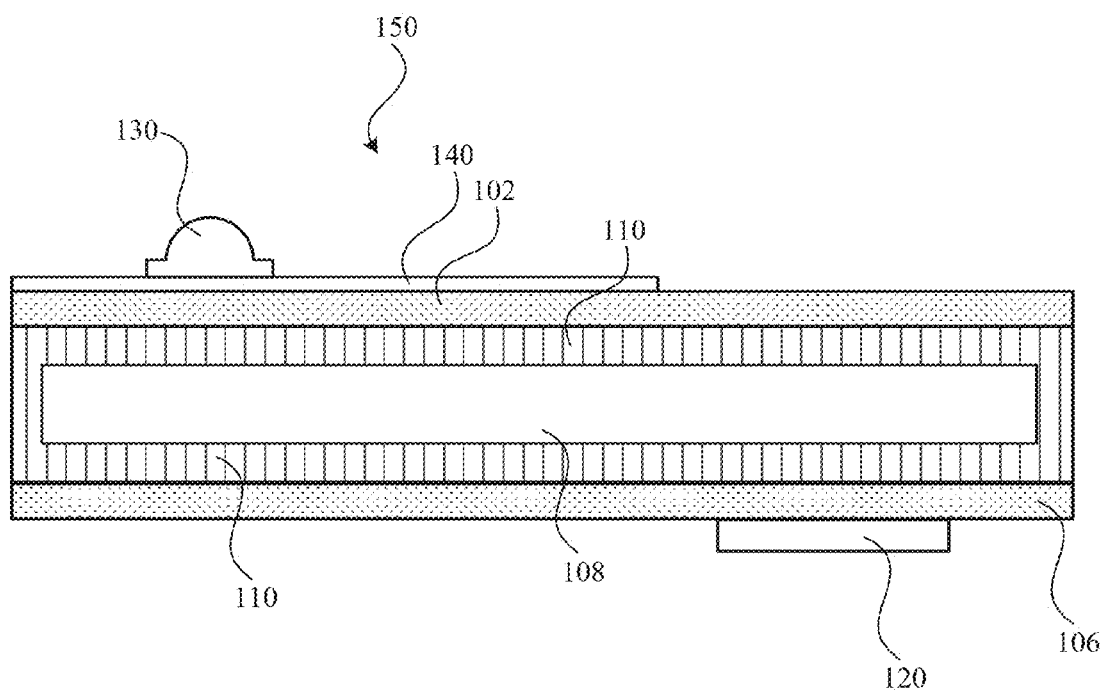
FIG. 2B illustrates a block diagram of a thermal ground plane according to some embodiments described herein.

FIG. 2B illustrates a block diagram of the thermal ground plane 150 with an LED 130 disposed on the containment layer 102 according to some embodiments described herein.

Figure 3B:
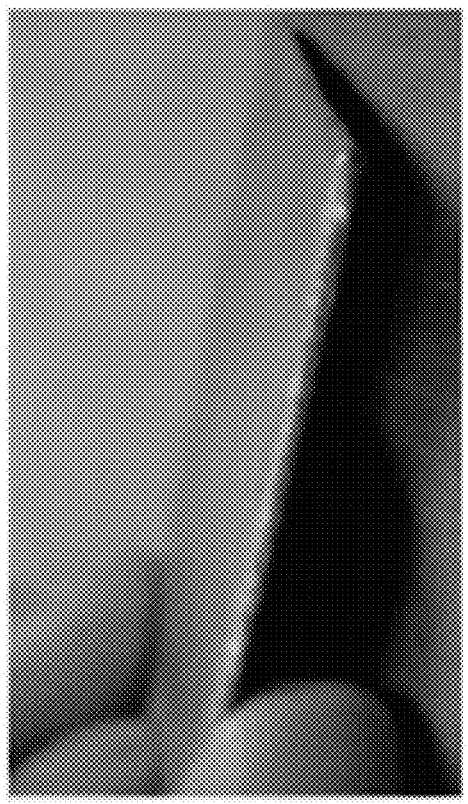
FIGS. 3A and 3B illustrate two examples of thermal ground planes according to some embodiments described herein.
Figure 3A:
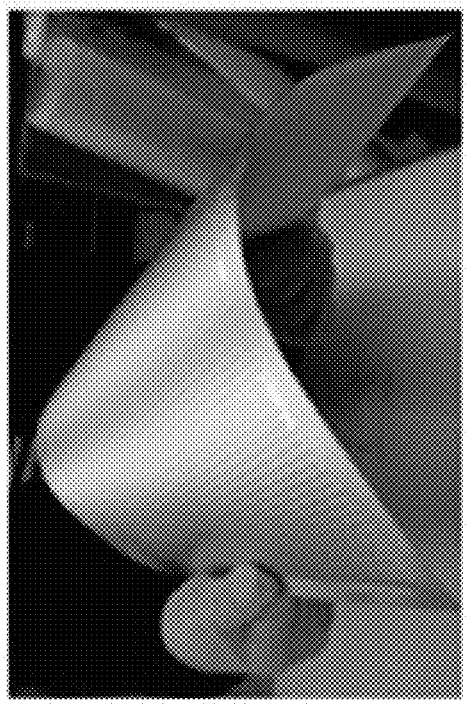

FIG. 3A shows an example of a flexible thermal ground plane according to some embodiments described herein. A flexible thermal ground plane, for example, may achieve its greatest flexibility through the use of a polymer-based construction of the containment layers, which may include thin metal cladding for hermetically sealing the thermal ground plane. In some embodiments, higher levels of thermal conductivity and heat flux may be achieved with a rigid, metallic-based thermal ground plane as shown in FIG. 3B.

Figure 4:
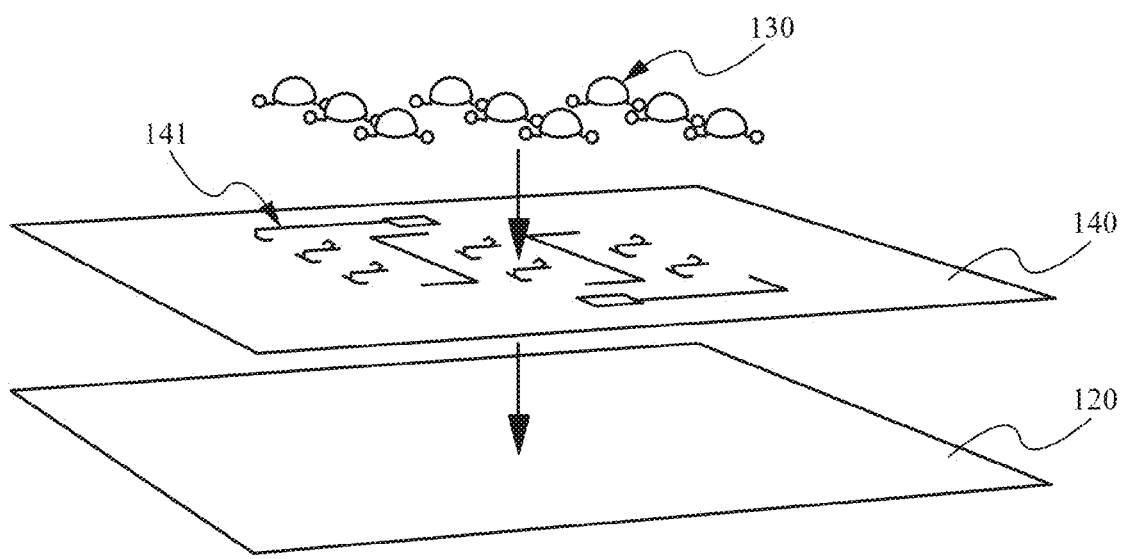
FIG. 4 illustrates another example of light-emitting diodes formed on a thermal ground plane according to some embodiments described herein.

FIG. 4 illustrates an example of a number of LEDs 130 coupled with a containment layer 102 of the thermal ground plane according to some embodiments described herein. As shown in the Figure, the LEDs 130 may be electrically connected with each other or with other components via traces 141 etched on the circuit carrier 140. The circuit carrier 140 may be coupled with the containment layer 102 of the thermal ground plane. The traces 141 may conduct electrical power to the various LEDs 130. The LEDs 130 may include an LED package, an LED on an LED carrier, a plurality of LEDs on a board, etc.

Figure 5:
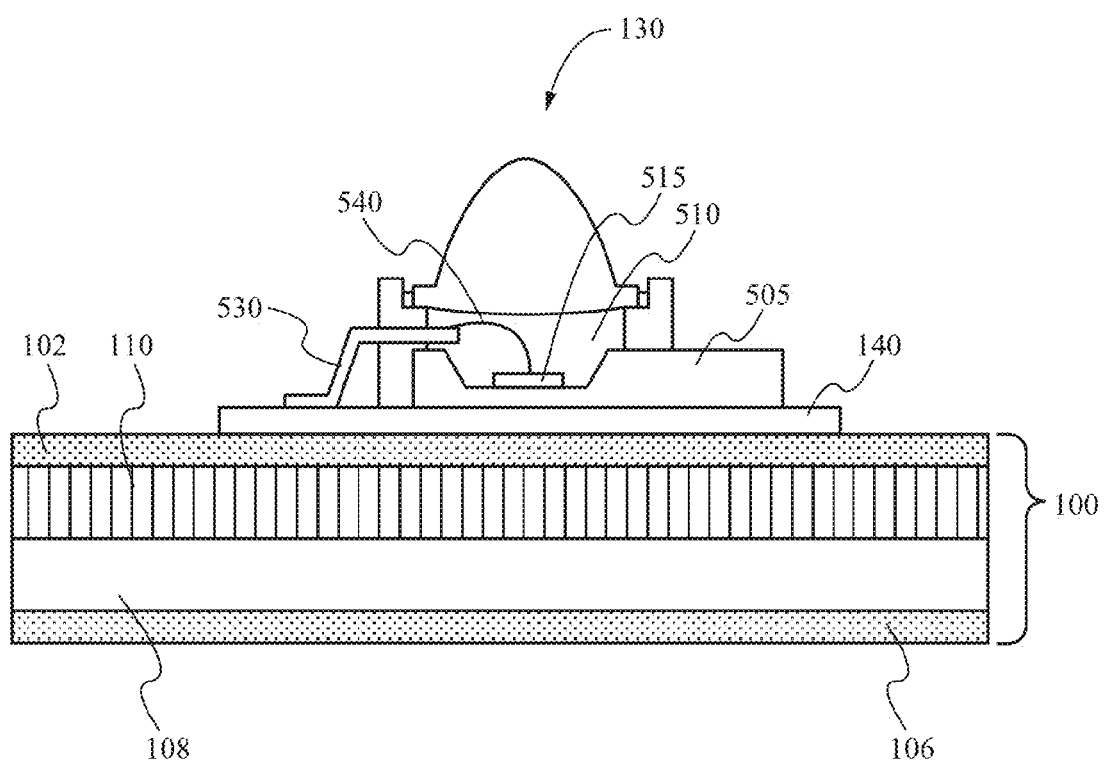
FIG. 5 illustrates an example of a number of light-emitting diodes integrated with a light-emitting diode according to some embodiments described herein.

FIG. 5 illustrates an example of the LED 130 coupled with a thermal ground plane 100 according to some embodiments described herein. The LED 130 may be constructed on the circuit carrier 140. In some embodiments, the circuit carrier 140 may be illuminated and the LED 130 may be constructed directly on the containment layer 102. A semiconductor die 515 may be disposed on a heat slug 505. Alternatively, the semiconductor die 515 may be disposed directly on the circuit carrier 140 and the containment layer 102 with the use of the heat slug 505. The semiconductor die 515 may be any type of semiconductor chip such as, for example, a gallium arsenide chip, an aluminum gallium arsenide chip, a gallium arsenide phosphide chip, an aluminum gallium indium phosphide chip, a gallium(III) phosphide chip, a zinc selenide chip, an indium gallium nitride, a silicon carbide chip, a silicon chip, an indium gallium nitride chip, a boron nitride chip, an aluminum nitride chip, an aluminum gallium nitride chip, an aluminum gallium indium nitride chip, etc. In some embodiments, more than one semiconductor die 515 may be included within the LED 130.

A bond wire 540 may provide a connection between an electrode 530 and the semiconductor die 515. The electrode 530 may be used as an electrical connection with the circuit carrier 140 and the semiconductor die 515. A resin mold 510 and/or an optical lens 520 may also be included. Various other components may be included. As shown in the figure, one or more of the LED components may be coupled directly with the thermal ground plane 100.

Figure 6:
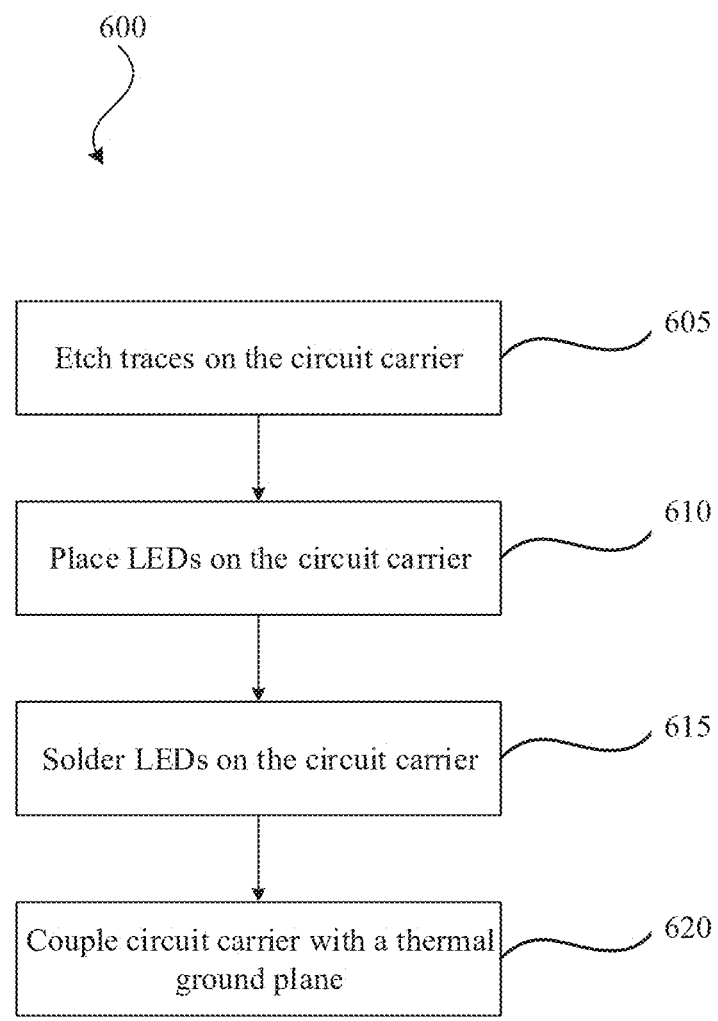
FIG. 6 is a flowchart of an example process for placing LEDs on a thermal ground plane according to some embodiments described herein.

FIG. 6 is a flowchart of a process 600 for placing LEDs on a thermal ground plane according to some embodiments described herein. The process 600 starts at block 605. At block 605, traces can be etched into a portion of the circuit carrier 140. At block 610 LEDs and/or other components may be placed on the circuit carrier 140. For example, one or more surface mount LEDs and/or electrical components may be placed on the circuit carrier 140. In some embodiments, an LED carrier with or without an LED may be placed on the circuit carrier 140. The LEDs and/or components, for example, may be placed on the circuit carrier 140 using solder paste.

At block 615 the LEDs and/or other components may be soldered on the circuit carrier 140 using such as, for example, a solder reflow process or the like. For example, during a solder reflow process, the circuit carrier and/or components (including LEDs) may be raised to a temperature below 170° C., 180° C., 190° C., 200° C., 210° C., 220° C., 230° C., 240° C., 250° C., 260° C., 270° C., 280° C., 290° C., etc.

At block 620 the circuit carrier 140 may be coupled with a containment layer of a thermal ground plane. For example, the circuit carrier 140 may be coupled with the thermal ground plane using any process or material known in the art such as, for example, thermal adhesive tape and/or thermal adhesive glue. Blocks 605 and 610 may occur in any order.

Figure 7:
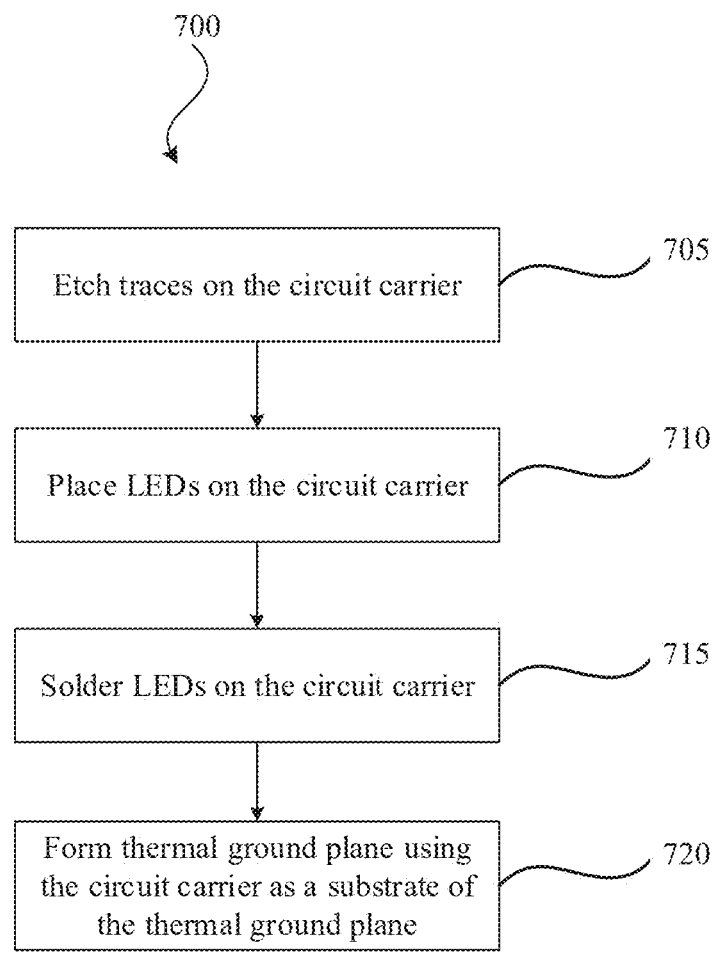
FIG. 7 is a flowchart of an example process for placing LEDs on a thermal ground plane according to some embodiments described herein.

FIG. 7 is a flowchart of a process 700 for placing LEDs on a thermal ground plane according to some embodiments described herein. The process 700 starts at block 705. At block 705, traces can be etched into a portion of the circuit carrier 140. At block 710 LEDs and/or other components may be placed on the circuit carrier 140. For example, one or more surface mount LEDs and/or electrical components may be placed on the circuit carrier 140. In some embodiments, an LED carrier with or without an LED may be placed on the circuit carrier 140. The LEDs and/or components, for example, may be placed on the circuit carrier 140 using solder paste.

At block 715 the LEDs and/or other components may be soldered on the circuit carrier 140 using such as, for example, a solder reflow process or the like. At block 710, a thermal ground plane may be formed using the circuit carrier 140 as a containment layer of the thermal ground plane.

Figure 8:
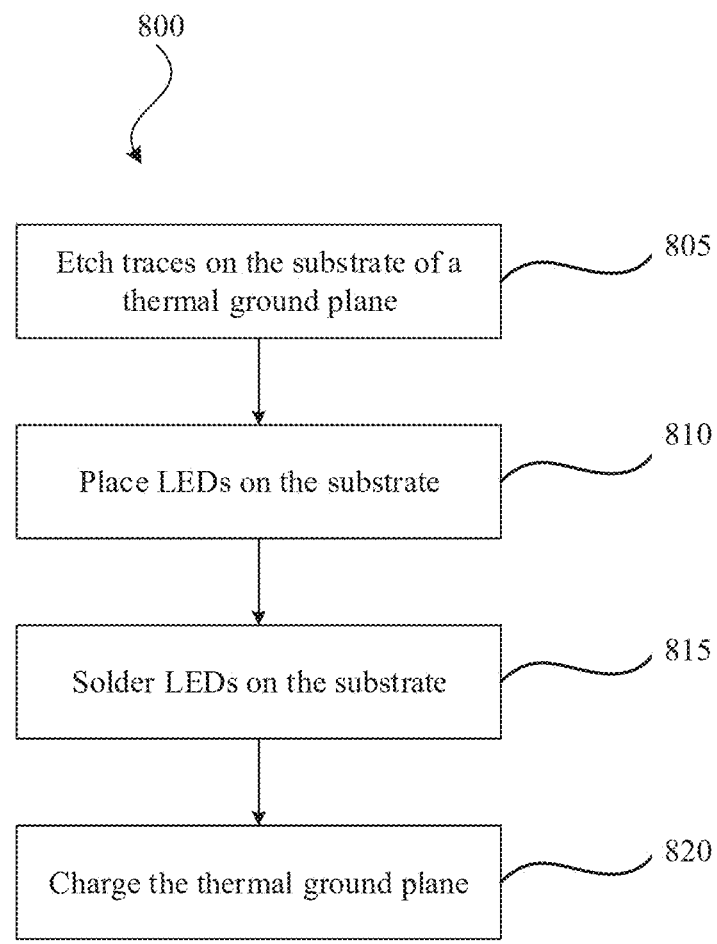
FIG. 8 is a flowchart of an example process for placing LEDs on a thermal ground plane according to some embodiments described herein.

FIG. 8 is a flowchart of a process 800 for placing LEDs on a thermal ground plane according to some embodiments described herein. The process 800 starts at block 805. At block 805, traces can be etched into a containment layer of a thermal ground plane. In this embodiment, the thermal ground plane may be constructed but not charged with a working fluid and/or may not be hermetically sealed. At block 810 LEDs and/or other components may be placed on the containment layer. In some embodiments, an LED carrier with or without an LED may be placed on the circuit carrier 140. For example, one or more surface mount LEDs and/or electrical components may be placed on the circuit carrier 140. The LEDs and/or components, for example, may be placed on the circuit carrier 140 using solder paste.

At block 815 the LEDs and/or other components may be soldered on the containment layer such as, for example, using a solder reflow process or the like. At block 820 the thermal ground plane may be charged with a working fluid and/or hermetically sealed. For example, during charging, air may be evacuated out of the thermal ground plane during charging. As another example, the working fluid may be placed within the thermal ground plane during charging. The working fluid may be placed within the thermal ground plane at an elevated pressure below (or in some embodiments above) the ambient pressure. As yet another example, the thermal ground plane may be hermetically sealed during charging. Evacuate the chamber from having any non-condensable gases (possibly at an elevated temperature) and/or adding the working fluid to the liquid cavity and/or vapor cavity.

In some embodiments, the thermal ground plane 100 may be charged by placing frozen working fluid (i.e., the working fluid in the solid phase state) inside the thermal ground plane such as, for example by placing the frozen working fluid between other layers of the thermal ground plane. Any remaining gases may also be evacuated from the thermal ground plane by introducing it to a vacuum.

Various other blocks may be included in any of the processes 600, 700, and/or 800. Moreover, any block may be omitted; and any of the blocks may be performed in any order.

Figure 9:
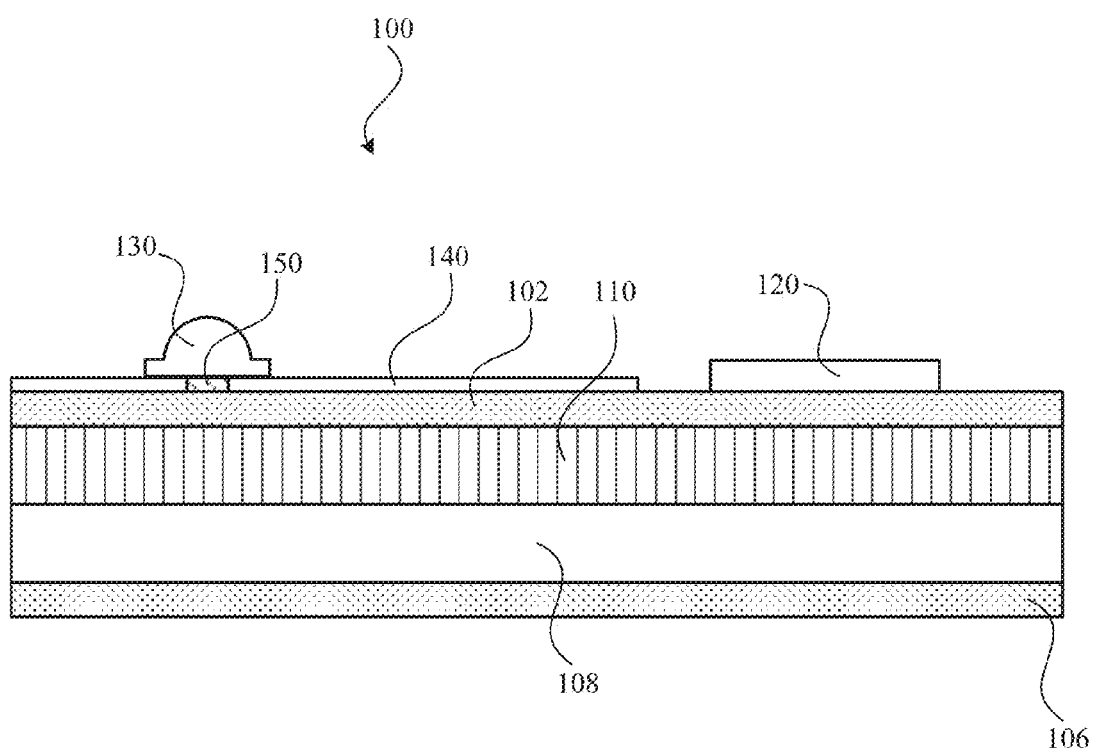
FIG. 9 shows another example of an LED coupled with a thermal ground plane according to some embodiments described herein.

An LED (or multiple LEDs) may be coupled with a thermal ground plane in a number of different ways. FIG. 9 shows another example of the LED 130 coupled with the thermal ground plane 100 according to some embodiments described herein. In some embodiments, the circuit carrier 140 may include a via (or hole) 150 that is placed where the LED or the LED carrier is placed on the circuit carrier 140. In some embodiments, the via 150 may be filled with thermal paste, conductive epoxy, thermal adhesive, copper, aluminum, etc. to conduct heat from the LED to the thermal ground plane.

Figure 10:
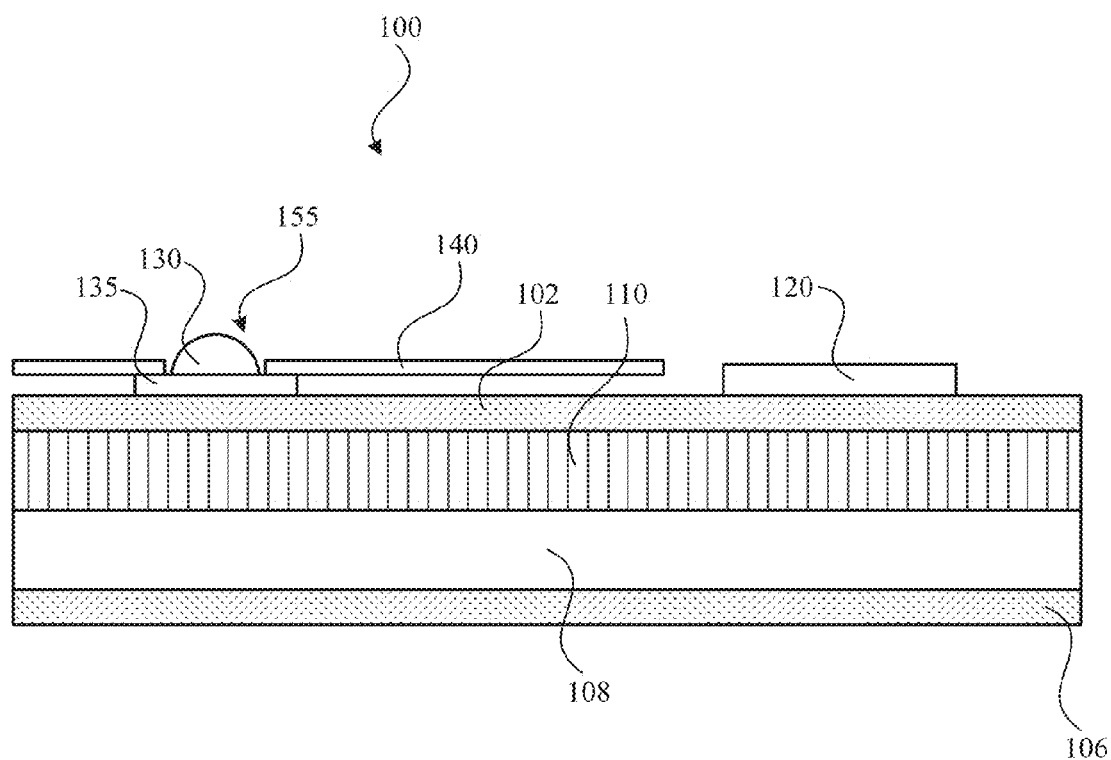
FIG. 10 shows another example of an LED and LED carrier coupled with a thermal ground plane according to some embodiments described herein.

FIG. 10 shows another example of the LED 130 and an LED carrier 135 coupled with the thermal ground plane 100 according to some embodiments described herein. In some embodiments, the circuit carrier 140 may include a via (or hole) 155 within which the LED 130 is placed. In this configuration, the LED carrier 135 is coupled with the opposite side of the circuit carrier 140 as shown in FIG. 8 and the side of the circuit carrier that is closest to the thermal ground plane. In this embodiment, the LED 130 and/or the LED carrier 135 may be more closely thermally connected with the thermal ground plane 100 and yet still have electrical connections through the circuit carrier 140.

A thermal ground plane that withstands a printed circuit board solder reflow cycle is also provided according to some embodiments described herein. Typical solder reflow processes are performed at temperatures around 270° C. At this temperature the working fluid of the thermal ground plane may expand and/or evaporate resulting in high pressures within the thermal ground plane. In some embodiments, a thermal ground plane may include one or more connections coupling the containment layer 102 and/or the containment layer 106 internally through the vapor cavity 108 and/or the liquid cavity. Such a thermal ground plane may be able to handle internal pressures greater than 80 psi, 90 psi, 100 psi, 110 psi, 120 psi, 130 psi, 140 psi, etc., without compromising the hermetic seal of the thermal ground plane and/or without releasing any of the working fluid. Various types of connections or physical apparatus may be used. In some embodiments, the internal construction of the thermal ground plane may be redesigned in order to accommodate the new structure without significantly compromising performance.

Unless otherwise noted, as used herein, "LED" may include, for example, a semiconductor die that produces light, an LED package that includes a semiconductor die with at least a lens and/or a lead, multiple semiconductor dies and/or leads in an assembly (an LED assembly), a one or more semiconductor dies and/or leads on a board (chip on board) package.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations, and/or additions to the present subject matter as would be readily apparent to one of ordinary skill in the art.

That which is claimed:

1. A method comprising:
   etching traces on a circuit carrier; placing one or more LEDs on the circuit carrier;
   soldering the one or more LEDs on the circuit carrier; and
   coupling the circuit carrier with the containment layer of a thermal ground plane after the soldering of the one or more LEDs on the circuit carrier, wherein the thermal ground plane includes a liquid cavity and a vapor cavity.

2. The method according to claim 1, wherein the one or more LEDs are placed on the circuit carrier using solder paste.

3. The method according to claim 1, wherein the soldering the one or more LEDs on the circuit carrier comprises heating the circuit carrier to a temperature below 260° C.

4. The method according to claim 1, wherein the circuit carrier is coupled with the containment layer of the thermal ground plane using a thermal adhesive.

5. The method of claim 1, further comprising charging the thermal ground plane with a working fluid after soldering the one or more LEDs on the circuit carrier and coupling the circuit carrier with the containment layer of the thermal ground plane.

6. The method of claim 1, wherein the vapor cavity includes a porous structure and the liquid cavity includes one or more wicking layers.

7. The method of claim 6, wherein the liquid cavity includes a plurality of microchannels etched into the containment layer of the thermal ground plane to form at least a portion of the one or more wicking layers.

8. The method of claim 6, wherein the one or more wicking layers include one or more hydrophilic coatings.

9. The method of claim 6, wherein the one or more wicking layers are configured to generate a capillary force to draw the working fluid through the one or more wicking layers.

10. The method of claim 6, wherein at least the porous structure or the one or more wicking layers includes a plurality of pillars.

11. The method of claim 5, wherein charging the thermal ground plane further comprises evacuating air from the thermal ground plane.

12. The method of claim 5, further comprising hermetically sealing the thermal ground plane after charging the thermal ground plane with the working fluid.

13. A method comprising:
    etching traces on a circuit carrier;
    placing one or more LEDs on the circuit carrier;
    soldering the one or more LEDs on the circuit carrier;
    forming a thermal ground plane using the circuit carrier as an external layer of the thermal ground plane after soldering the one or more LEDs on the circuit carrier, wherein the thermal ground plane includes a liquid cavity and a vapor cavity;
    charging the thermal ground plane with a working fluid after soldering the one or more LEDs on the circuit carrier; and
    hermetically sealing the thermal ground plane after charging the thermal ground plane with the working fluid and soldering the one or more LEDs on the circuit carrier.

14. The method according to claim 13, wherein charging the thermal ground plane with the working fluid occurs at a reduced pressure relative to ambient.

15. The method according to claim 13, wherein the one or more LEDs are placed on the circuit carrier using solder paste.

16. The method according to claim 13, wherein the soldering the one or more LEDs on the circuit carrier comprises heating the circuit carrier to a temperature below 260° C.

17. The method of claim 13, wherein the liquid cavity includes one or more wicking layers.

18. A method comprising:
    etching traces on a containment layer of a thermal ground plane, wherein the thermal ground plane includes a liquid cavity and a vapor cavity;
    placing one or more LEDs on the containment layer of the thermal ground plane utilizing a solder paste;
    soldering the one or more LEDs on the containment layer of the thermal ground plane utilizing a solder reflow process; and
    charging the thermal ground plane with a working fluid after soldering the one or more LEDs on the containment layer of the thermal ground plane utilizing the solder reflow process.

19. The method according to claim 18, wherein charging the thermal ground plane with the working fluid further comprises placing with working fluid within the thermal ground plane at a pressure less than ambient pressure after soldering the one or more LEDs on the containment layer of the thermal ground plane.

20. The method according to claim 18, wherein charging the thermal ground plane with the working fluid further comprises placing the working fluid within the thermal ground plane at a pressure greater than ambient pressure after soldering the one or more LEDs on the containment layer of the thermal ground plane.

21. The method according to claim 18, wherein charging the thermal ground plane with the working fluid further comprises hermetically sealing the thermal ground plane after placing the working fluid within the thermal ground plane and soldering the one or more LEDs on the containment layer of the thermal ground plane utilizing the solder reflow process.

22. The method according to claim 18, wherein the soldering the one or more LEDs on the containment layer comprises heating the containment layer to a temperature below 260° C.

23. The method of claim 18, further comprising evacuating air from the thermal ground plane before charging the thermal ground plane with the working fluid.

24. The method of claim 18, wherein at least the vapor cavity includes a porous structure or the liquid cavity includes one or more wicking layers.

* * * * *